United States Patent
Joshi et al.

(10) Patent No.: US 11,721,608 B2
(45) Date of Patent: Aug. 8, 2023

(54) POWER ELECTRONICS ASSEMBLIES HAVING VAPOR CHAMBERS WITH INTEGRATED PEDESTALS

(71) Applicant: Toyota Motor Engineering & Manufacturing North America, Inc., Plano, TX (US)

(72) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 352 days.

(21) Appl. No.: 17/165,253

(22) Filed: Feb. 2, 2021

(65) Prior Publication Data
US 2022/0246492 A1    Aug. 4, 2022

(51) Int. Cl.
| | |
|---|---|
| *H01L 23/427* | (2006.01) |
| *H05K 1/18* | (2006.01) |
| *H01L 23/46* | (2006.01) |
| *H01L 23/36* | (2006.01) |
| *H01L 23/367* | (2006.01) |
| *H01L 23/473* | (2006.01) |

(52) U.S. Cl.
CPC ............ *H01L 23/427* (2013.01); *H01L 23/36* (2013.01); *H01L 23/367* (2013.01); *H01L 23/3675* (2013.01); *H01L 23/46* (2013.01); *H01L 23/473* (2013.01); *H05K 1/183* (2013.01); *H05K 2201/1056* (2013.01); *H05K 2201/10166* (2013.01); *H05K 2201/10174* (2013.01); *H05K 2201/10515* (2013.01)

(58) Field of Classification Search
CPC ..... H01L 23/427; H01L 23/36; H01L 23/367; H01L 23/3675; H01L 23/46; H01L 23/473; H05K 1/183; H05K 2201/10515
See application file for complete search history.

(56) References Cited

U.S. PATENT DOCUMENTS

| | | | |
|---|---|---|---|
| 6,661,660 B2 | 12/2003 | Prasher et al. | |
| 7,334,630 B2 | 2/2008 | Goodson et al. | |
| 11,153,965 B1 * | 10/2021 | Jennings | H05K 1/0272 |
| 2009/0007841 A1 | 1/2009 | Hirata et al. | |
| 2017/0156240 A1 | 6/2017 | Silvennoinen et al. | |
| 2018/0145382 A1 | 5/2018 | Harris et al. | |
| 2019/0239395 A1 | 8/2019 | Joshi et al. | |
| 2019/0348345 A1 * | 11/2019 | Parida | H01L 25/18 |
| 2020/0404802 A1 * | 12/2020 | Takahashi | H05K 7/20309 |
| 2022/0192060 A1 * | 6/2022 | Joshi | H01L 23/3733 |

* cited by examiner

*Primary Examiner* — David Vu
*Assistant Examiner* — Brandon C Fox
(74) *Attorney, Agent, or Firm* — Dinsmore & Shohl LLP

(57) ABSTRACT

A power electronics assembly includes a vapor chamber and a heat-generating device. The vapor chamber includes a housing defining an evaporator side and a condenser side and a pedestal integrally formed with an extending from the evaporator side, the pedestal comprising a non-rectangular shape corresponding to a thermal management objective. The heat-generating device is coupled to the pedestal.

15 Claims, 5 Drawing Sheets

POWER ELECTRONICS ASSEMBLIES HAVING VAPOR CHAMBERS WITH INTEGRATED PEDESTALS

TECHNICAL FIELD

The present specification generally relates to power electronics assemblies and, more specifically, to power electronics assemblies with vapor chambers having integrated pedestals.

BACKGROUND

As background, power electronic devices, such as power insulated-gate bipolar transistors (IGBTs), may be used in electric vehicle applications as switches, for example, to convert DC power to AC power to drive electric motors. Power electronic devices may generate significant amounts of heat during operation. For example, silicon carbide (SiC) power electronic devices may operate at temperatures up to and/or above 250° C. Accordingly, power electronics devices may need structures configured to provide cooling. These structures may often be large, thereby taking up more space than desirable, leading to a smaller power density. However, integration of smaller cooling assemblies may result in inefficient or inadequate cooling. As electronics packaging becomes smaller, it is desirable to provide unique cooling assemblies that balance the desire for efficient cooling which maintaining a small volume profile, thereby increasing power density.

SUMMARY

In one embodiment, a power electronics assembly includes a vapor chamber and a heat-generating device. The vapor chamber includes a housing defining an evaporator side and a condenser side and a pedestal integrally formed with and extending from the evaporator side, the pedestal comprising a non-rectangular shape corresponding to a thermal management objective. The heat-generating device is coupled to the pedestal.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
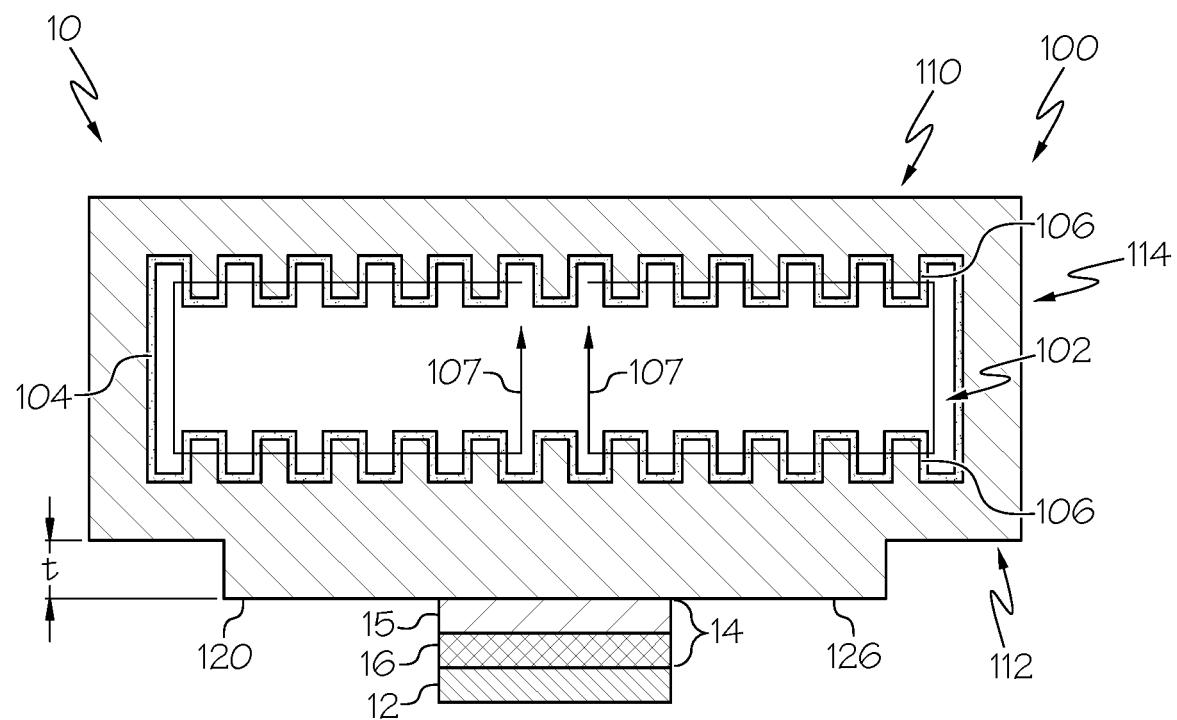
FIG. 1 schematically depicts a cutaway side view of a power electronics assembly including a vapor chamber having an integral pedestal, according to one or more embodiments shown and described herein.

The present disclosure generally relates various embodiments of a power electronics assembly having an integrated pedestal, of which one embodiment is depicted in FIG. 1. In particular, the power electronics assembly may include a vapor chamber and a heat-generating device mounted to the vapor chamber. The vapor chamber includes an integrated pedestal that extends from an evaporator side. The heat-generating device is mounted to the pedestal (e.g., either directly or through one or more layers as will be described in more detail herein). The pedestal is formed of a thermally conductive material and thereby provides more thermally conductive material between the heat-generating device and the interior of the vapor chamber. The shape of the pedestal may be adjusted to correspond to a thermal management objective. Such a thermal management objective may include reducing peak heat flux at the substrate-wick interface, reducing thermal resistance, reducing transient temperature spikes, conducting heat to a desired location, or the like. Various embodiments of the power electronics assembly will be described in greater detail below.

FIG. 1 generally depicts a power electronics assembly 10. A power electronics assembly 10 may be, for example, a power control unit (PCU) having any number of heat generating devices, cooling device(s), gate drivers, printed circuit boards (PCB), capacitors, etc. In embodiments, power electronics assemblies as described herein may be used in vehicle applications for converting DC power to AC power to drive electric motors, though other uses are contemplated and possible. In the present embodiment, the power electronics assembly 10 includes a heat-generating device 12 and a vapor chamber 100. One or more bonding layers 14 may bond the heat-generating device 12 to the vapor chamber 100.

The heat-generating device 12 may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 12 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the heat-generating device 12 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power electronics assembly 10.

It should be understood that vapor chambers are a type of cooling device, which may be used to remove heat flux from the heat-generating device 12. Accordingly, the vapor chamber 100 may be formed from any thermally conductive material(s) (e.g., copper, aluminum, silver, gold, or other thermally conductive material), which allows for conduction of heat away from the heat-generating device 12. Formed within the vapor chamber 100 may be an enclosed chamber 102 which circulates a cooling fluid represented by arrows 107 between an evaporator side 112 and a condenser side 110 of the enclosed chamber 102. In embodiments, porous media 104 may be sintered to the inner walls of the enclosed chamber 102, which may allow the cooling fluid to flow toward the evaporator side 112 from the condenser side 110 via capillary action. At the evaporator side 112, the cooling fluid may be evaporated and transported as steam toward the condenser side 110 where the cooling fluid is cooled and condensed back to liquid, which then flows back to the evaporator side 112, where the cycle may repeat.

In embodiments, extending from the inner walls of the enclosed chamber 102 may be one or more pins 106 (e.g., machined pins), such as an array of pins. The one or more pins 106 may extend from one of the evaporator side 112, the condenser side 110, or both. The porous media 104 may also be sintered to these one or more pins 106, such that the one or more pins 106 are also covered in porous media 104. The one or more pins 106 may provide a larger surface area promoting improved heat transfer between the cooling fluid and the vapor chamber 100.

The evaporator side 112 and the condenser side 110 may generally define the main body portion 114 of the vapor chamber 100. Extending from the evaporator side 112 of the vapor chamber 100 (and the main body portion 114) may be the pedestal 120. The pedestal 120 is formed of any thermally conductive material(s) (e.g., copper, aluminum, silver, gold, etc.). In embodiments, the pedestal 120 may be integrally formed with the evaporator side 112 so as to be a single unitary piece with the evaporator side 112 of the vapor chamber 100. By incorporating the pedestal 120 directly into the vapor chamber 100 so as to be integral therewith, additional bonding layers (e.g., direct-bonded copper (DBC) layers between the pedestal 120 and the main body portion 114 would be unnecessary, thereby reducing the size of the power electronics assembly 10. However, it is contemplated that in some embodiments, the pedestal 120 is a separate component coupled to the evaporator side 112 of the vapor chamber 100.

As depicted in the present embodiment, the pedestal 120 may define a smaller cross-sectional area than the evaporator side 112 of the vapor chamber 100. For example, the vapor chamber 100 may be 40% or less pedestal by volume fraction, though other percentages are contemplated and possible (e.g., about 50% or less, about 30% or less, about 15% or less, etc.). Though the pedestal 120 may have any desired thickness (or the distance the pedestal 120 extends from the evaporator side 112), t, in some embodiments, the thickness, t, may be between about 1 mm to about 3 mm depending the particular assembly, the thermal management objective, or the like).

Still referring to FIG. 1, the heat-generating device 12 may be mounted to the pedestal 120. Accordingly, the pedestal 120 provides more thermally conductive material between the heat-generating device 12 and the porous media 104 (or wick structure) than conventional vapor chambers without a pedestal. The heat-generating device 12 may be mounted directly to the pedestal 120 or may be mounted to the pedestal 120 via the one or more bonding layers 14. The one or more bonding layers 14 may include any number of thermally conductive layers. Often, heat-generating devices may be attached to a cooling device via a DBC substrate that provides electrical insulation. DBC substrates generally include outer copper layers and an inner ceramic, electrically insulative layer (e.g., alumina, aluminum nitride, beryllium oxide, or the like). In the present embodiment, a portion of the DBC substrate may be incorporated into the pedestal 120. For example, a ceramic layer 15 may be directly deposited onto a planar mounting surface 126 of the pedestal 120. A copper interface layer 16 may be directly attached to the ceramic layer 15 (for example, using electroplating, bonding, or the like), and the heat-generating device 12 may be bonded to the copper layer (for example, via soldering). In other embodiments, it is contemplated that the heat-generating device 12 may be directly bonded (for example, soldered) to the planar mounting surface 126 of the pedestal 120.

Figure 2:
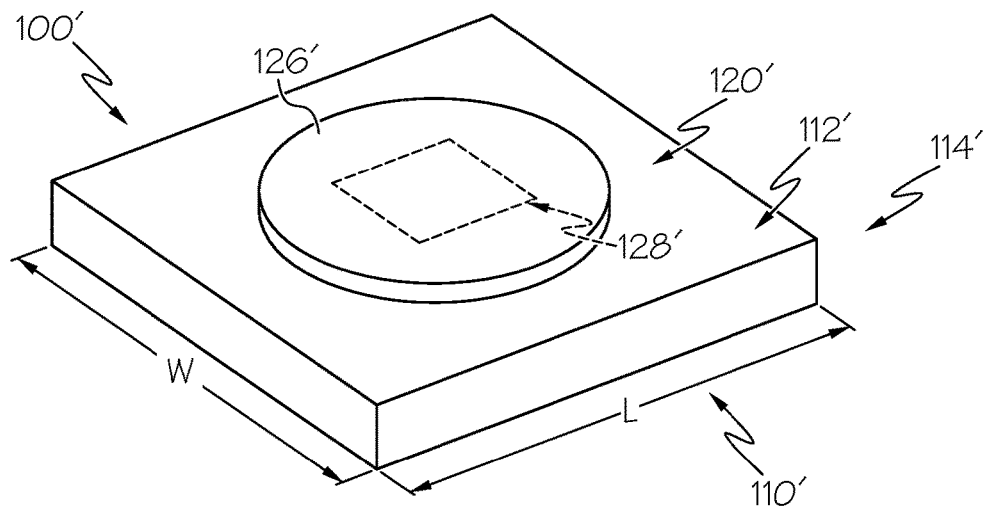
FIG. 2 schematically depicts a perspective view of a vapor chamber having a round integral pedestal, according to one or more embodiments shown and described herein.
Figure 3:
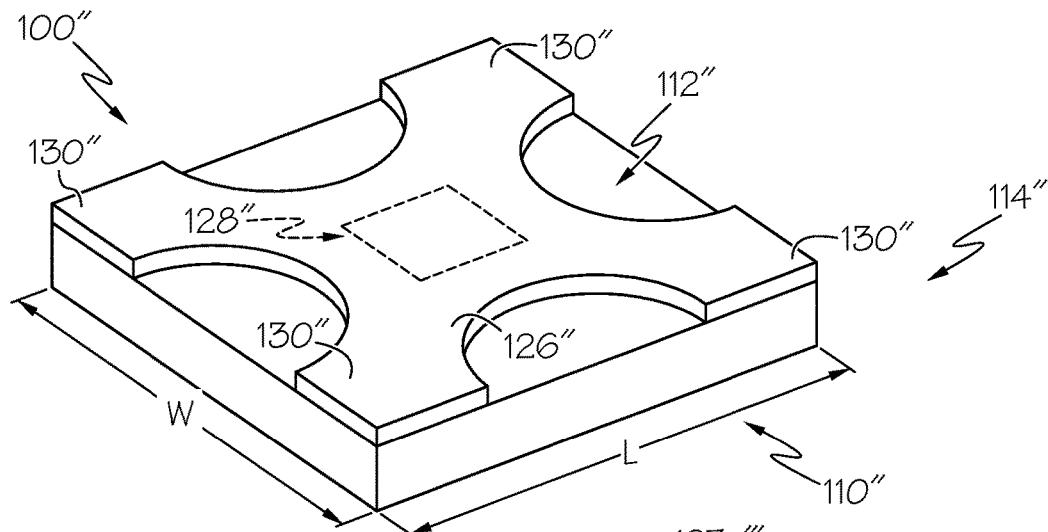
FIG. 3 schematically depicts a perspective view of another embodiment of a vapor chamber having an integral pedestal defining a plurality of wings extending from a central mounting region, according to one or more embodiments shown and described herein.
Figure 4:
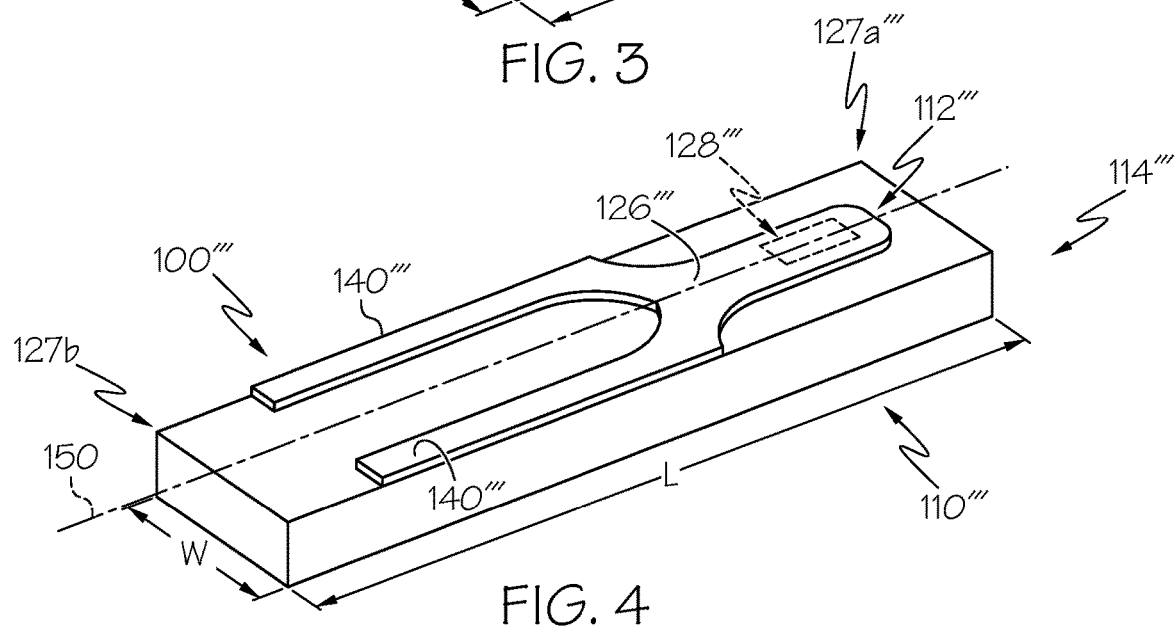
FIG. 4 schematically depicts a perspective view of yet another embodiment of a vapor chamber having an integral pedestal having a forked shape, according to one or more embodiments shown and described herein.

The pedestal 120 may be designed using structural topology optimization to balance the desire for increased heat spreading and maintaining a volume profile of the power electronics assembly 10. The structural topology optimization may also be based on the size of the heat-generating device, the number of heat-generating devices, and/or a location of the heat sink. For example, the pedestal 120 may have a non-rectangular shape to achieve or correspond to any desired thermal management objective (e.g., conducting heat in a desired direction, reducing peak heat flux at a substrate-wick interface, reducing thermal resistance, reducing transient temperature spikes, or the like). However, in other embodiments, it is contemplated that pedestals may be a rectangular shape. Referring to FIGS. 2-4, vapor chambers 100', 100", and 100''', respectively, each depict an example non-rectangular pedestal 120', 120", and 120''', respectfully. It is noted that the vapor chambers 100', 100", and 100''' are substantially similar to vapor chamber 100 described above with respect to FIG. 1 unless otherwise noted or apparent and may be mounted to a heat-generating device 12, as described above to provide a power electronics assembly 10.

Referring specifically to FIG. 2, the main body portion 114' of the vapor chamber 100' is generally square, though other shapes are contemplated and possible. For example, the main body portion 114' of the vapor chamber 100' may have an overall width, w, and an overall length, l, such that the main body of the vapor chamber 100'. The main body portion 114' may have any suitable dimensions such as, but not limited to, greater than about 50 mm (w) by about 50 mm (l), such as 100 mm (w) by about 100 mm (l) or greater. It is noted that larger pedestals such as used herein, may aid in providing improved heat transfer and cooling. The pedestal 120' extends from the evaporator side 112' of the main body portion 114' any suitable distance such as, but not limited to, about 1 mm to about 3 mm. In the indicated embodiment, the pedestal 120' has a circular cross section has a planar mounting surface 126' that defines a mounting location 128' for a heat generating device such as described above. In the present embodiment, the mounting location 128' is located centrally within the planar mounting surface 126' though other locations are contemplated and possible. The planar mounting surface 126' may, in some embodiments, have a surface area between about 6 to about 15 times greater ((for example about 9 to about 10 times greater) than an area of a surface of the heat generating device that is to be mounted to the planar mounting surface 126'. In the present embodiment, the vapor chamber 100' is about 40% pedestal by volume fraction, though other volume fractions are contemplated and possible (for example, but not limited to, between about 10% volume fraction to about 50% volume fraction).

Referring now to FIG. 3, the main body portion 114" of the vapor chamber 100" is generally square, though other shapes are contemplated and possible. For example, the main body portion 114" of the vapor chamber 100" may have an overall width, w, and an overall length, l, such that the main body of the vapor chamber 100". The main body portion 114" may have any suitable dimensions such as, but not limited to, about 50 mm (w) by about 50 mm (l) or more, such as 100 mm (w) by about 100 mm (l). The pedestal 120" extends from the evaporator side 112" of the main body portion 114" any suitable distance such as, but not limited to, about 1 mm to about 3 mm. In the indicated embodiment, the pedestal 120" has an irregular shape having a planar mounting surface 126". In particular, the pedestal 120' has centrally located mounting location 128" and a plurality of wings 130", such as two or more wings, extending from the mounting location 128' to each corner, such as the four corners, of the vapor chamber 100". Such embodiment may be useful where there are multiple heat sinks positioned adjacent to four corners of the vapor chamber 100" for guiding heat toward the four corners of the vapor chamber 100". It is noted that a greater or fewer number of wings may be included without departing from the scope of the present disclosure. As noted in the embodiment above, the planar mounting surface 126" may, in some embodiments, have a surface area between about 6 to about 15 times greater (for example about 9 to about 10 times greater) than an area of a surface of the heat generating device that is to be mounted to the planar mounting surface 126". In the present embodiment, the vapor chamber 100" about 40% pedestal by volume fraction of the vapor chamber 100", though other volume fractions are contemplated and possible (for example, but not limited to, between about 10% volume fraction to about 50% volume fraction).

Referring specifically to FIG. 4, the main body portion 114''' of the vapor chamber 100''' is generally rectangular, though other shapes are contemplated and possible. For example, the main body portion 114''' of the vapor chamber 100''' may have an overall width, w, and an overall length, l. The main body portion 114" may have any suitable dimensions such as, but not limited to, about 25 mm (w) by about 50 mm (l) or more, such as 50 mm (w) by about 100 mm (l). The pedestal 120''' extends from the evaporator side 112''' of the main body portion 114''' any suitable distance such as, but not limited to, about 1 mm to about 3 mm. In the indicated embodiment, the pedestal 120''' has an irregular shape having a planar mounting surface 126'''. In particular, the pedestal 120''' has a mounting location 128" located adjacent a first end 127a''' of the evaporator side 112''' and two or more extending wings 140''' extending from the mounting location 128'''. In the depicted embodiment, the two or more extending wings 140''' extend alongside and parallel to one another across a centerline 150''' of the heat exchanger and along opposing edges of the evaporator side 112''' of the vapor chamber 100''' toward a second end 127b''' of the vapor chamber 100''' opposite the first end 127a'''. In such an embodiment, heat generated via a heat-generating device would be rejected toward the second end 127b''' of the vapor chamber 100'''. Such embodiments, may be useful when spatial constraints of the structure of the powder device assembly and surrounding structure requires the heat sink to be positioned toward one side of the vapor chamber 100''' or another.

As noted in the embodiments above, the planar mounting surface 126''' may be between about 6 to about 15 times greater ((for example about 9 to about 10 times greater) than an area of a surface of the heat generating device that is to be mounted to the planar mounting surface 126'''. In the present embodiment, the vapor chamber 100''' about 15% pedestal 120''' by volume fraction, though other volume fractions are contemplated and possible (for example, but not limited to, between about 10% by volume fraction to about 50% by volume fraction).

It is noted that the embodiments depicted in FIGS. 2-4 are non-limiting and that modifications may be made depending on the various structural constraints of the power electronics assembly and other surrounding structure (e.g., such as within a vehicle).

Figure 5:
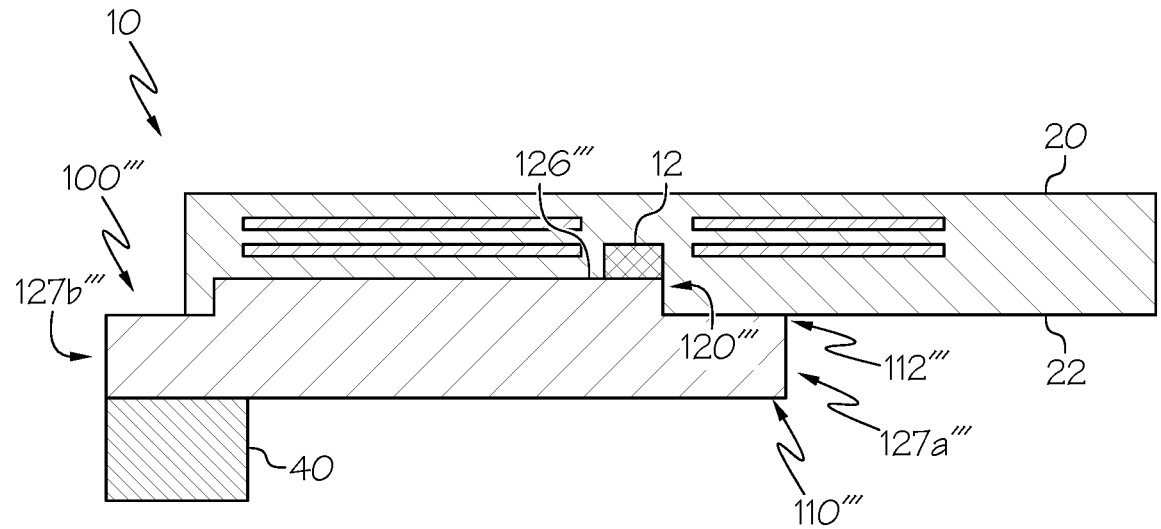
FIG. 5 schematically depicts a cutaway side view of a power electronics assembly wherein a heat generating device is embedded within a printed circuit board (PCB), according to one or more embodiments shown and described herein.

Referring now to FIG. 5, power electronics assembly 10 is depicted. In the depicted embodiment, the power electronics assembly 10 includes a vapor chamber 100''' such as described with respect to FIG. 4. However, it is noted that any of the vapor chambers described herein may be incorporated into the present embodiment. The present embodiment further includes a printed circuit board (PCB) 20. The PCB 20 may provide structure and/or conductive paths to which various components may be mounted and electrically coupled. In the depicted embodiment, the heat-generating device 12 and the vapor chamber 100 are embedded within the PCB 20. For example, the heat-generating device 12 may be encapsulated between the vapor chamber 100''' and the PCB 20. In the depicted embodiment, the vapor chamber 100''' may be partially embedded within the PCB 20. For example, the pedestal 120''' may be embedded within the PCB 20 and the evaporator side 112''' may be abutted with an exterior surface 22 of the PCB 20 and/or the condenser side 110''' of the vapor chamber 100''' may be positioned external to and facing away from the PCB 20. In the indicated embodiment, a heat sink 40 (e.g., a condenser) may be mounted to the condenser side 110''' of the PCB 20 toward the second end 127b''' of the vapor chamber 100'''. In some embodiments, such as where the heat-generating device 12 is directly soldered to the PCB 20, the pedestal 120 may be incorporated as a conduction layer for conducting electricity as part of the power electronics assembly 10. In such embodiments, cooling fluid within the vapor chamber 100''' may be dielectric and/or an electrically insulative material may separate the heat sink 40 from the vapor chamber 100'''.

It is noted that each of the embodiments provided herein enable use of larger vapor chambers relative to ones that may be conventionally used, which may allow for improved cooling of the heat-generating device. Additionally, several other benefits may be achieved which will be discussed in greater detail below.

Figure 6:
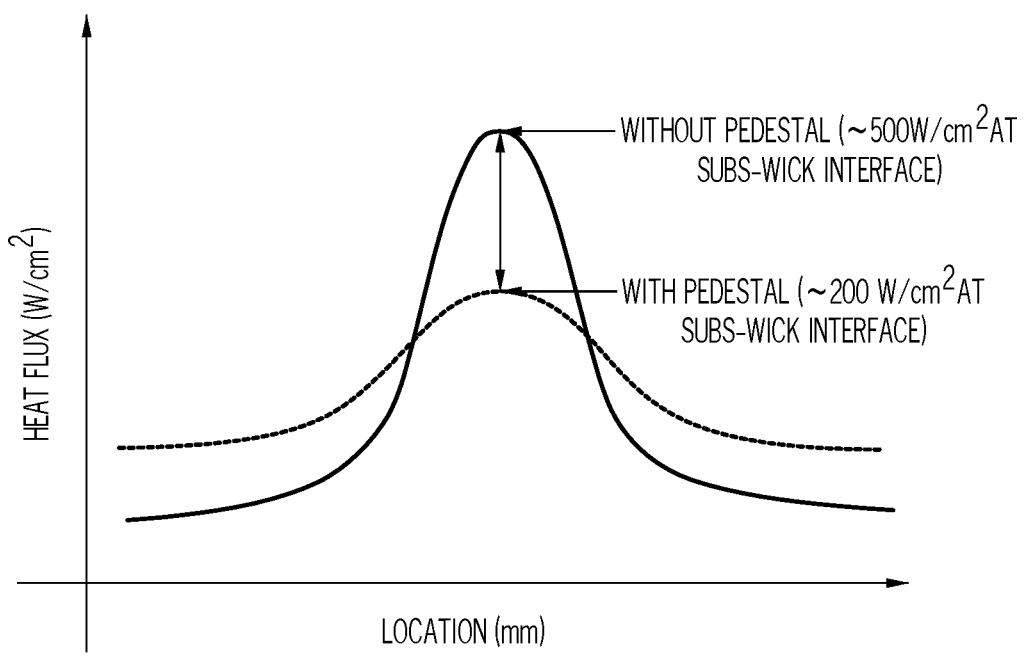
FIG. 6 depicts a graph of heat flux versus location within a conventional power electronics assembly and a power electronics assembly according to one or more embodiments shown and described herein.

For example, FIG. 6 compares use of a conventional 50 mm×50 mm vapor chamber without a pedestal with a 100 mm×100 mm vapor chamber including a pedestal, such as described above. The additional material of the pedestal provides additional heat spreading prior to reaching the porous media 104 (e.g., the vapor-wick interface) within the vapor chamber, which reduces peak heat flux at the substrate-wick interface of the vapor chamber. In such an embodiment, the peak heat flux experienced by the vapor chamber with the pedestal is 300 W/cm$^2$ less that the peak heat flex of the vapor chamber without the pedestal.

Figure 7:
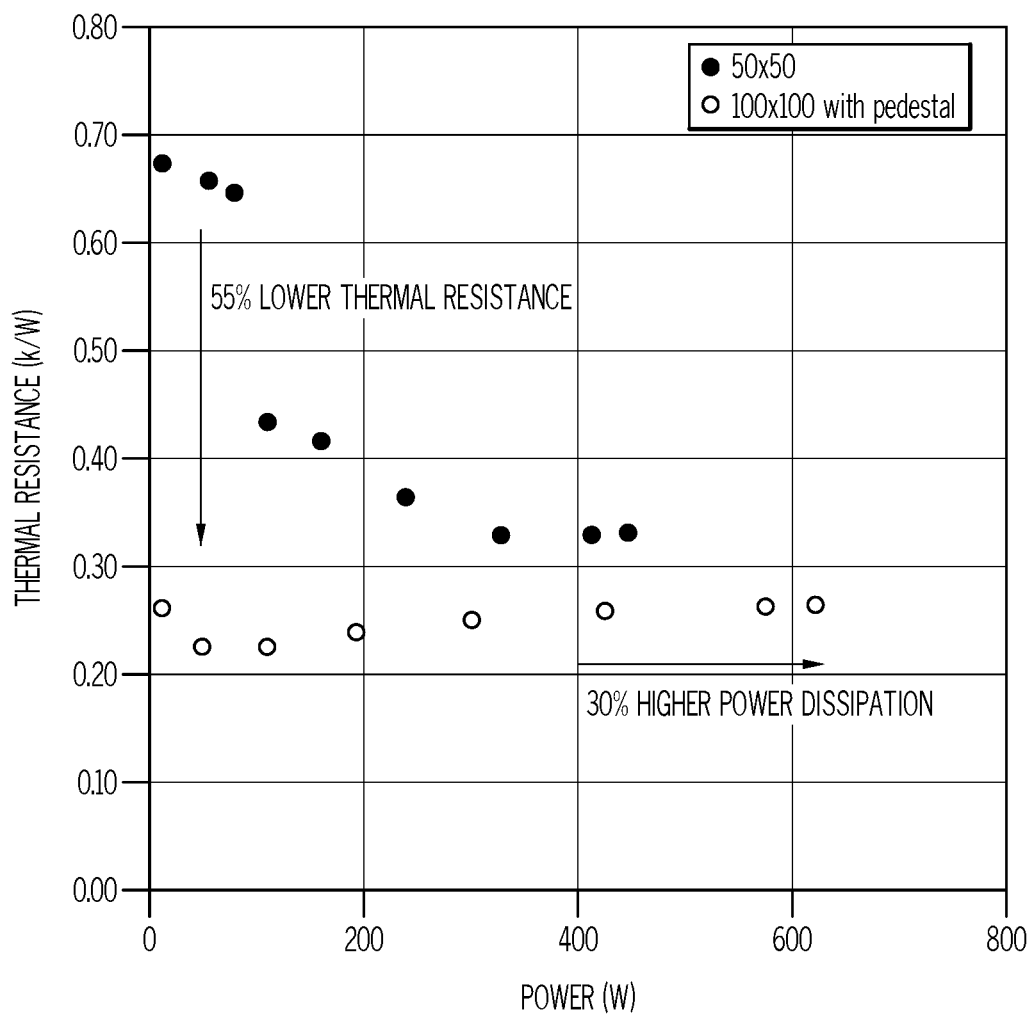
FIG. 7 depicts a graph of thermal resistance versus power of conventional power electronics assembly and a power electronics assembly according to one or more embodiments shown and described herein.
Figure 8:
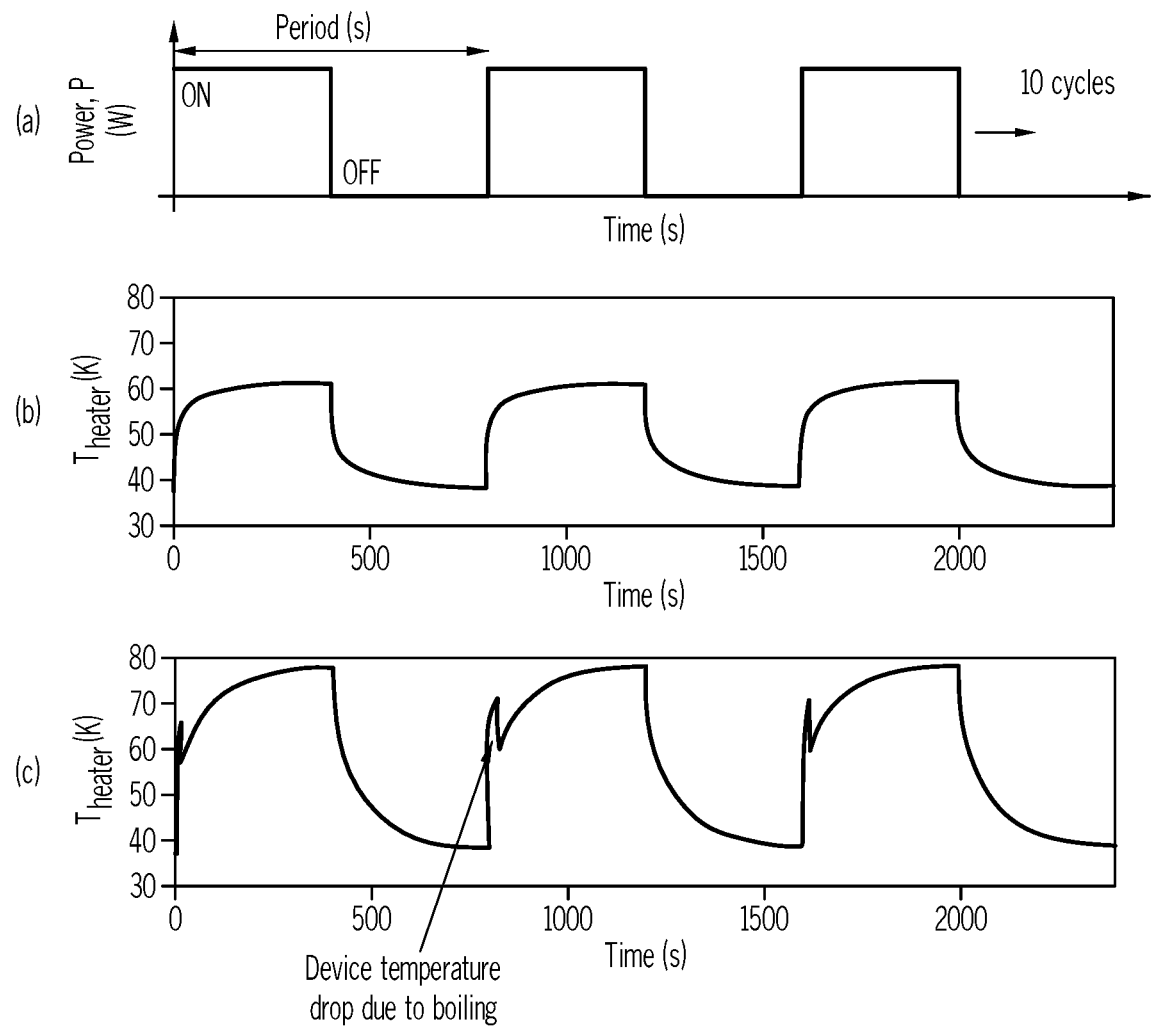
FIG. 8 depicts a graphical representation of transient temperature spikes experienced in conventional power device assemblies and a power electronics assembly according to one or more embodiments shown and described herein.

Referring now to FIG. 7, a comparison of thermal resistance versus power of a 50 mm×50 mm vapor chamber without a pedestal and a 100 mm×100 mm vapor chamber with a pedestal is provided. As illustrated thermal resistance of a power electronics assembly decreases through use of the larger vapor chamber and pedestal. For example, thermal resistance may be about 55% lower with the vapor chamber having a pedestal as compared to the vapor chamber without. In embodiments, the thermal resistance within a power device may be between about 0.2 K/W to about 0.3 K/W. Additionally, about 30% high power dissipation may be achieved when incorporating the vapor chamber having the pedestal, as described herein.

Incorporation of a larger vapor chamber and pedestal also reduces transient temperature spikes in a power electronics assembly at the onset of boiling of the coolant fluid. For example, as the power device is turned on and off depicted in chart a, chart b depicts the changes in temperature in the power electronics assembly which includes the vapor chamber and incorporated pedestal. Comparatively, chart c depicts a vapor chamber without a pedestal. As shown at the start of each curve, a transient temperature spike occurs. Such transient temperature spikes occur due to the thermal resistance of the package, which may result in undue wear and stress on the power device assembly. As depicted by the smooth curves of chart b, such temperature spikes may be largely avoided due to reduced package thermal resistance provided by the pedestal.

It should now be understood that embodiments of the present disclosure are directed to power device assemblies that include vapor chambers with integrated pedestals. In particular, the vapor chamber includes an integrated pedestal that extends from an evaporator side. The heat-generating device may be mounted to the pedestal (e.g., either directly or through one or more layers as will be described in more detail herein). The pedestal may be formed of a thermally conductive material and thereby provides more thermally conductive material between the heat-generating device and the interior of the vapor chamber. The shape of the pedestal may be adjusted to correspond to a thermal management objective. Such objectives may include reducing peak heat flux at the substrate-wick interface, reducing thermal resistance, a reducing transient temperature spikes, conducting heat to a desired location, or the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
   a vapor chamber comprising:
      a housing defining an evaporator side and a condenser side; and
      a pedestal integrally formed with and extending from the evaporator side, the pedestal comprising a non-rectangular shape corresponding to a thermal management objective; and
   a heat-generating device coupled to the pedestal.

2. The power electronics assembly of claim 1, further comprising a copper interface layer positioned between the heat-generating device and the pedestal coupling the heat-generating device to the pedestal.

3. The power electronics assembly of claim 1, further comprising a ceramic layer deposited on a surface of the pedestal between the pedestal and the heat-generating device.

4. The power electronics assembly of claim 1, further comprising a printed circuit board (PCB), wherein the heat-generating device and the pedestal are embedded within the PCB.

5. The power electronics assembly of claim 4, wherein the condenser side of the vapor chamber is positioned external to the PCB.

6. The power electronics assembly of claim 5, further comprising a heat sink mounted to the condenser side of the vapor chamber, the heat sink being positioned so as to be laterally offset from the heat-generating device.

7. The power electronics assembly of claim 1, wherein the pedestal is circular.

8. The power electronics assembly of claim 1, wherein the pedestal comprises a plurality of wings extending to each corner of the evaporator side of the vapor chamber.

9. The power electronics assembly of claim 1, wherein the pedestal comprises a mounting region, and two or more wings extending from the mounting region.

10. The power electronics assembly of claim 9, wherein the two or more wings extend alongside and parallel to one another.

11. The power electronics assembly of claim 10, further comprising a heat sink mounted to the condenser side of the vapor chamber, wherein the two or more wings extend toward a location of the heat sink.

12. The power electronics assembly of claim 1, wherein the vapor chamber is 40% or less pedestal by volume fraction.

13. The power electronics assembly of claim 1, comprising a thermal resistance between about 0.2 K/W to about 0.3 K/W.

14. The power electronics assembly of claim 1, wherein the heat-generating device is a silicon carbide (SiC) chip.

15. The power electronics assembly of claim 1, wherein the thermal management objective comprises at least one of reducing a peak heat flux, reducing thermal resistance, increasing power dissipation, or reducing transient temperature spikes.

* * * * *

UNITED STATES PATENT AND TRADEMARK OFFICE
CERTIFICATE OF CORRECTION

| | |
|---|---|
| PATENT NO. | : 11,721,608 B2 |
| APPLICATION NO. | : 17/165253 |
| DATED | : August 8, 2023 |
| INVENTOR(S) | : Shailesh N. Joshi and Ercan Mehmet Dede |

It is certified that error appears in the above-identified patent and that said Letters Patent is hereby corrected as shown below:

In the Specification

In Column 4, Line(s) 3, after "depending", insert --on--.

In Column 4, Line(s) 66, after "section", insert --and--.

In Column 5, Line(s) 6, before "(for", delete "(".

In Column 6, Line(s) 12, before "(for", delete "(".

In Column 7, Line(s) 4, after "less", delete "that" and insert --than--, therefor.

In Column 7, Line(s) 5, delete "flex" insert --flux--, therefor.

In Column 7, Line(s) 48, before "reducing", delete "a".

Signed and Sealed this
Nineteenth Day of September, 2023

Katherine Kelly Vidal
*Director of the United States Patent and Trademark Office*